(12) United States Patent
Ji et al.

(10) Patent No.: US 10,658,529 B2
(45) Date of Patent: May 19, 2020

(54) SOLAR CELL AND MANUFACTURING METHOD THEREOF

(71) Applicant: LG ELECTRONICS INC., Seoul (KR)

(72) Inventors: Kwangsun Ji, Seoul (KR); Seungjik Lee, Seoul (KR); Sehwon Ahn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 201 days.

(21) Appl. No.: 14/297,330

(22) Filed: Jun. 5, 2014

(65) Prior Publication Data

US 2014/0360571 A1 Dec. 11, 2014

(30) Foreign Application Priority Data

Jun. 5, 2013 (KR) .................. 10-2013-0064787

(51) Int. Cl.
*H01L 31/0224* (2006.01)
*H01L 21/30* (2006.01)
(Continued)

(52) U.S. Cl.
CPC .. *H01L 31/022441* (2013.01); *H01L 21/3003* (2013.01); *H01L 31/0745* (2013.01);
(Continued)

(58) Field of Classification Search
CPC ......... H01L 31/0682; H01L 31/022441; H01L 31/022458; H01L 31/1804; H01L 31/0745; H01L 31/0747; H01L 31/1868
See application file for complete search history.

(56) References Cited

U.S. PATENT DOCUMENTS 4,213,798 A * 7/1980 Williams .......... H01L 31/03921
136/255
5,057,439 A * 10/1991 Swanson ......... H01L 31/022425
136/256
(Continued)

FOREIGN PATENT DOCUMENTS

JP         10-190033 A     7/1998
JP          4837662 B2    12/2011
KR   10-2010-0075045 A     7/2010

OTHER PUBLICATIONS

Pankove, et al., "Hydrogenation and dehydrogenation of amorphous and crystalline silicon", Applied Physics Letters, vol. 32 (1978), pp. 439-441.*

(Continued)

*Primary Examiner* — William E McClain
(74) *Attorney, Agent, or Firm* — Birch, Stewart, Kolasch & Birch, LLP

(57) ABSTRACT

A manufacturing method of a solar cell is discussed. The manufacturing method of the solar cell includes forming a tunneling layer on one surface of a semiconductor substrate, forming a semiconductor layer on the tunneling layer, doping the semiconductor layer with a first conductive dopant and a second conductive dopant to form a first conductive semiconductor layer and a second conductive semiconductor layer, and diffusing hydrogen into the first and second conductive semiconductor layers to hydrogenate the first and second conductive semiconductor layers.

14 Claims, 9 Drawing Sheets

(51) Int. Cl.
  *H01L 31/0745* (2012.01)
  *H01L 31/18* (2006.01)
  *H01L 31/0747* (2012.01)

(52) U.S. Cl.
  CPC ...... *H01L 31/0747* (2013.01); *H01L 31/1804* (2013.01); *H01L 31/1868* (2013.01); *Y02E 10/547* (2013.01); *Y02P 70/521* (2015.11)

(56) References Cited

U.S. PATENT DOCUMENTS

| | | | | |
|---|---|---|---|---|
| 6,071,753 | A * | 6/2000 | Arimoto | H01L 31/02168 136/255 |
| 6,468,885 | B1 * | 10/2002 | Mahan | C23C 16/24 257/E21.101 |
| 7,468,485 | B1 * | 12/2008 | Swanson | H01L 31/03682 136/243 |
| 2006/0130891 | A1 * | 6/2006 | Carlson | H01L 31/02168 136/256 |
| 2007/0169808 | A1 * | 7/2007 | Kherani | H01L 31/0745 136/258 |
| 2007/0256728 | A1 * | 11/2007 | Cousins | H01L 31/0745 136/252 |
| 2008/0254203 | A1 * | 10/2008 | Zhou | C23C 16/345 427/74 |
| 2009/0133753 | A1 * | 5/2009 | Sasaki | H01L 31/075 136/261 |
| 2009/0151784 | A1 * | 6/2009 | Luan | H01L 31/02168 136/256 |
| 2009/0223562 | A1 * | 9/2009 | Niira | H01L 31/1804 136/256 |
| 2009/0308438 | A1 * | 12/2009 | De Ceuster | H01L 31/022441 136/255 |
| 2010/0055822 | A1 * | 3/2010 | Weidman | G01T 1/2018 438/57 |
| 2010/0081264 | A1 * | 4/2010 | Leung | H01L 21/228 438/548 |
| 2010/0087031 | A1 * | 4/2010 | Veschetti | H01L 31/0745 438/72 |
| 2010/0139764 | A1 * | 6/2010 | Smith | H01L 31/182 136/256 |
| 2010/0154869 | A1 * | 6/2010 | Oh | H01L 31/022425 136/252 |
| 2010/0154876 | A1 * | 6/2010 | Camalleri | H01L 31/182 136/255 |
| 2010/0193027 | A1 * | 8/2010 | Ji | H01L 31/02168 136/256 |
| 2011/0126898 | A1 * | 6/2011 | Harley | H01L 31/0682 136/256 |
| 2011/0303280 | A1 * | 12/2011 | Pawlak | H01L 31/1804 136/256 |
| 2012/0060904 | A1 * | 3/2012 | Smith | H01L 31/035218 136/252 |
| 2012/0073650 | A1 * | 3/2012 | Smith | H01L 31/062 136/258 |
| 2012/0085403 | A1 * | 4/2012 | Sauar | H01L 31/022425 136/256 |
| 2012/0167978 | A1 * | 7/2012 | Shin | H01L 31/022441 136/256 |
| 2012/0247560 | A1 * | 10/2012 | Rim | H01L 21/02381 136/261 |
| 2012/0318340 | A1 * | 12/2012 | Heng | H01L 31/0745 136/255 |
| 2012/0322199 | A1 * | 12/2012 | Graff | H01L 31/0682 438/97 |
| 2014/0096817 | A1 * | 4/2014 | Xie | H01L 31/035209 136/255 |
| 2014/0159042 | A1 * | 6/2014 | Hutchings | H01L 21/02529 257/52 |
| 2014/0227825 | A1 * | 8/2014 | Chen | H01L 31/077 438/87 |

OTHER PUBLICATIONS

Slaoui, et al., "Passivation and etching of fine-grained polycrystalline silicon films by hydrogen treatment", Solar Energy Materials & Solar Cells, 90 (2006), 2087-2098.*

Aberle, "Overview on SiN surface passivation of crystalline silicon solar cells." Solar energy materials and solar cells 65.1-4 (2001): 239-248.*

Nagel, et al., "Exceptionally high bulk minority-carrier lifetimes in block-cast multicrystalline silicon." Proceedings of the 14th European Photovoltaic Solar Energy Conference, Barcelona, Spain. 1997.*

Reichel, et al., "Decoupling charge carrier collection and metallization geometry of back-contacted back-junction silicon solar cells by using insulating thin films." 2010 35th IEEE Photovoltaic Specialists Conference. IEEE, 2010.*

Dingemans, et al., "Recent progress in the development and understanding of silicon surface passivation by aluminum oxide for photovoltaics." Proceedings of the 25th European Photovoltaic Solar Energy Conference, Valencia, Spain. 2010.*

Dingemans, et al. "Status and prospects of Al2O3-based surface passivation schemes for silicon solar cells." Journal of Vacuum Science & Technology A: Vacuum, Surfaces, and Films 30.4 (2012): 040802.*

Albadri, "Characterization of Al2O3 surface passivation of silicon solar cells." Thin Solid Films 562 (2014): 451-455.*

Gatz, et al. "Thermal stability of amorphous silicon/silicon nitride stacks for passivating crystalline silicon solar cells." Applied Physics Letters 93.17 (2008): 173502.*

Ulyashin, et al. "Hydrogen release and defect formation during heat treatments of SiNx: H/a-Si: H double passivation layer on c-Si substrate." 2006 IEEE 4th World Conference on Photovoltaic Energy Conference. vol. 2. IEEE, 2006.*

* cited by examiner

SOLAR CELL AND MANUFACTURING METHOD THEREOF

CROSS-REFERENCE TO RELATED APPLICATION

This application claims the priority benefit of Korean Patent Application No. 10-2013-0064787, filed on Jun. 5, 2013 in the Korean Intellectual Property Office, the disclosure of which is incorporated herein by reference.

BACKGROUND OF THE INVENTION

1. Field of the Invention

The embodiments of the invention relate to a solar cell and a manufacturing method thereof and, more particularly, to a solar cell having a heterojunction structure and a manufacturing method thereof.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

These solar cells may be fabricated via formation of various layers and electrodes based on design. The design of various layers and electrodes may determine the efficiency of a solar cell. Low efficiency of a solar cell must be overcome in order to commercialize the solar cell. Therefore, it is necessary to design various layers and electrodes of a solar cell such that the efficiency of the solar cell can be maximized. In addition, it is necessary to simplify a manufacturing process of a solar cell having various layers and electrodes.

SUMMARY OF THE INVENTION

It is an object of the embodiment of the invention to provide a solar cell having excellent characteristics and high productivity and a manufacturing method thereof.

In accordance with an aspect of the embodiment of the invention, the above and other objects can be accomplished by the provision of a manufacturing method of a solar cell including forming a tunneling layer on one surface of a semiconductor substrate, forming a semiconductor layer on the tunneling layer, doping the semiconductor layer with a first conductive dopant and a second conductive dopant to form a first conductive semiconductor layer and a second conductive semiconductor layer, and diffusing hydrogen into the first and second conductive semiconductor layers to hydrogenate the first and second conductive semiconductor layers.

In accordance with another aspect of the embodiment of the invention, there is provided a solar cell including a semiconductor substrate, a tunneling layer formed on one surface of the semiconductor substrate, first and second conductive semiconductor layers formed on the tunneling layer, the first and second conductive semiconductor layers including a semiconductor containing hydrogen, an insulation layer formed at the first and second conductive semiconductor layers in contact with the first and second conductive semiconductor layers, and first and second electrodes respectively connected to the first and second conductive semiconductor layers through the insulation layer, wherein the first and second conductive semiconductor layers have a hydrogen content of 7 at % to 20 at %.

BRIEF DESCRIPTION OF THE DRAWINGS

The above and other objects, features and other advantages of the embodiment of the invention will be more clearly understood from the following detailed description taken in conjunction with the accompanying drawings, in which.

DETAILED DESCRIPTION OF THE EMBODIMENTS

Figure 1:
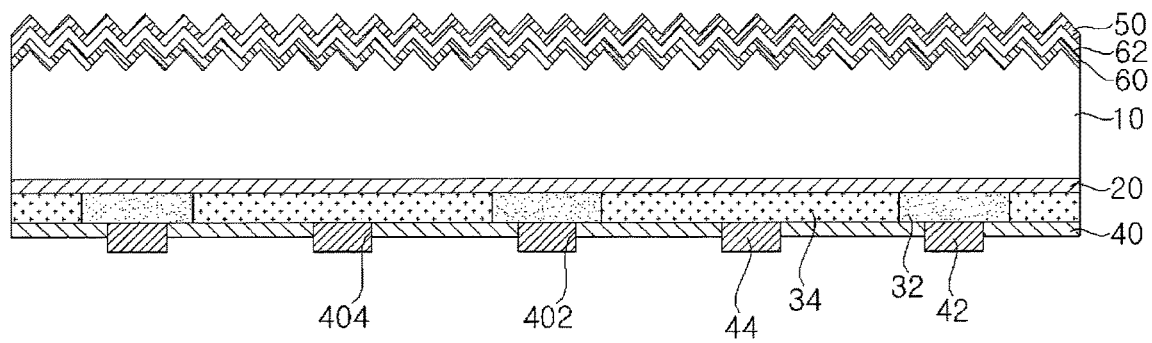
FIG. 1 is a sectional view of a solar cell according to an embodiment of the invention.

Reference will now be made in detail to the embodiments of the invention, examples of which are illustrated in the accompanying drawings. However, it will be understood that the invention should not be limited to the embodiments and may be modified in various ways.

In the drawings, to clearly and briefly explain the embodiment of the invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the embodiment of the invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, solar cells according to embodiments of the invention will be described in detail with reference to the accompanying drawings.

FIG. 1 is a sectional view of a solar cell according to an embodiment of the invention.

Referring to FIG. 1, a solar cell 100 according to an embodiment of the invention includes a semiconductor substrate 10, a tunneling layer 20 formed on one surface (for example, back surface) of the semiconductor substrate 10, and a first conductive semiconductor layer 32 and a second conductive semiconductor layer 34 formed on the tunneling layer 20. The solar cell 100 may further include first and second electrodes 42 and 44 connected to the first and second conductive semiconductor layers 32 and 34 to collect a carrier. In addition, the solar cell 100 may further include an insulation layer 40, a passivation film 60, a front surface field layer 62, and an anti-reflection film 50. These components of the solar cell 100 will hereinafter be described in more detail.

The semiconductor substrate 10 may contain a low doping concentration of a first conductive dopant. In this instance, the semiconductor substrate 10 may be formed of, for example, silicon containing the first conductive dopant. The silicon may be single crystal silicon. The first conductive dopant may be, for example, an n-type dopant or a p-type dopant. That is, the first conductive dopant may be an n-type dopant including a group-V element, such as phosphorus (P), arsenic (As), bismuth (Bi), or antimony (Sb). Alternatively, the first conductive dopant may be a p-type dopant including a group-III element, such as boron (B), aluminum (Al), gallium (Ga), or Indium (In).

In this instance, the semiconductor substrate 10 may contain an n-type dopant as the first conductive dopant. As a result, the second conductive semiconductor layer 34 forming a tunnel junction with the semiconductor substrate 10 via the tunneling layer 20 may be a p-type semiconductor layer. Consequently, it is possible to increase the size of the second conductive semiconductor layer 34 functioning as an emitter perform photoelectric conversion through junction with the semiconductor substrate 10 and thus to effectively collect holes, which have lower movement speed than electrons. When light is emitted to the tunnel junction, electrons generated by a photoelectric effect are collected by the first electrode 22. Holes moves toward the front surface of the semiconductor substrate 10 and are collected by the second electrode 42. As a result, electrical energy is generated. However, the embodiment of the invention is not limited thereto. For example, the semiconductor substrate 10 may be a p-type semiconductor substrate, the first conductive semiconductor layer 32 may be a p-type semiconductor layer, and the second conductive semiconductor layer 34 may be an n-type semiconductor layer.

The front surface of the semiconductor substrate 10 may be a textured surface provided with a concavo-convex shape, such as a pyramidal shape, but may also be other shapes. The textured front surface of the semiconductor substrate 10, provided with the concavo-convex shape, may attain increased surface roughness, which may reduce reflectance of incident light upon the front surface of the semiconductor substrate 10. Consequently, the quantity of light reaching the tunnel junction formed by the semiconductor substrate 10 and the second conductive semiconductor layer 34 may be increased, whereby light loss of the solar cell 100 may be minimized.

The back surface of the semiconductor substrate 10 may be a relatively smooth and flat surface having lower surface roughness than the front surface of the semiconductor substrate 10 by mirror grinding. As a result, light transmitted through the semiconductor substrate 10 and directed to the back surface of the semiconductor substrate 10 may be reflected by the back surface of the semiconductor substrate 10 such that the light is directed to the semiconductor substrate 10. In an instance in which the tunnel junction is formed at the back surface of the semiconductor substrate 10 by the tunneling layer 20 as in this embodiment, characteristics of the solar cell 100 may be greatly changed based on characteristics of the back surface of the semiconductor substrate 10. For this reason, the back surface of the semiconductor substrate 10 is not textured. That is, no concavo-convex shape is formed at the back surface of the semiconductor substrate 10. However, the embodiment of the invention is not limited thereto. Various other modifications are also possible.

The passivation film 60, the front surface field layer 62, and the anti-reflection film 50 may be sequentially formed at the front surface of the semiconductor substrate 10 (that is, on the semiconductor substrate 10). The passivation film 60, the front surface field layer 62, and the anti-reflection film 50 may be formed over the entire front surface of the semiconductor substrate 10. As a result, the respective layers may have maximized effects. In addition, no patterning is required, whereby the manufacturing process is simplified.

The passivation film 60 basically serves to passivate defects present in the front surface or bulk of the semiconductor substrate 10. The front surface field layer 62 contains a higher doping concentration of the first conductive dopant than the semiconductor substrate 10 and thus has a similar function to a back surface field (BSF) layer. That is, the front surface field layer 62 generates an electric field to prevent recombination of a carrier at the front surface of the semiconductor substrate 10. This may increase an open-circuit voltage Voc of the solar cell 100. The anti-reflection film 50 may reduce reflectance of incident light upon the front surface of the semiconductor substrate 10 to increase the quantity of light reaching the tunnel junction. This may increase a short-circuit current Isc of the solar cell 100.

For example, the passivation film 60 and/or the anti-reflection film 50 may have a single film structure or a multi-layer film structure formed of at least one selected from a group consisting of silicon nitride, silicon nitride containing hydrogen, silicon oxide, silicon oxide nitride, $MgF_2$, ZnS, $TiO_2$, and $CeO_2$. Alternatively, the passivation film 60 may be formed of an intrinsic amorphous semiconductor (for example, amorphous silicon).

For example, the front surface field layer 62 may be formed of an amorphous semiconductor (for example, amorphous silicon) doped with the first conductive dopant. However, the embodiment of the invention is not limited thereto. In an instance in which the anti-reflection film 50 or the like contains sufficient fixed charges, the front surface field layer 62 may not be formed.

However, the embodiment of the invention is not limited thereto. The passivation film 60, the front surface field layer 62, and the anti-reflection film 50 may be formed of various other materials. The terms a "passivation film 60", a "front surface field layer 62," and an "anti-reflection film 50" are used only for the convenience of description and, therefore, the embodiment of the invention is not limited thereto. That is, one layer may simultaneously perform at least two functions selected from among a passivation function, a field generation function, and an anti-reflection function. For example, the anti-reflection film 50, containing fixed charges, may simultaneously perform the field generation function and the anti-reflection function. In this instance, the front surface field layer 62 may not be formed. In addition, the formation sequence of the passivation film 60, the front surface field layer 62, and the anti-reflection film 50 may be variously changed. In one example, in this embodiment, the front surface field layer 62 may be disposed on the passivation film 60 separately from the semiconductor substrate 10. In another example, the front surface field layer 62 may be formed on the semiconductor substrate 10 while having a higher doping concentration of the first conductive dopant than the semiconductor substrate 10. In this instance, the passivation film 60 and/or the anti-reflection film 50 may be disposed on the front surface field layer 62. In addition, various other modifications are also possible.

In this embodiment, the tunneling layer 20 is formed at the back surface of the semiconductor substrate 10. Interface characteristics of the back surface of the semiconductor substrate 10 may be improved due to the tunneling layer 20 and the generated carrier may be satisfactorily transmitted due to the tunneling effect. The tunneling layer 20 may contain various materials, by which the carrier is tunneled. For example, the tunneling layer 20 may contain an oxide, a nitride, a conductive polymer, etc. In this instance, the tunneling layer 20 may be formed over the entire back surface of the semiconductor substrate 10. As a result, the entire back surface of the semiconductor substrate 10 may be passivated and easily flattened without patterning.

In order to sufficiently provide the tunneling effect, the tunneling layer 20 may have a thickness of 5 nm or less. Specifically, the tunneling layer 20 may have a thickness of 0.5 nm to 5 nm (for example, 1 nm to 4 nm). If the thickness of the tunneling layer 20 is greater than 5 nm, tunneling is not satisfactorily performed with the result that the solar cell 100 may not operate. On the other hand, if the thickness of the tunneling layer 20 is less than 0.5 nm, it may be difficult to form the tunneling layer 20 with desired quality. In order to further improve the tunneling effect, the tunneling layer 20 may have a thickness of 1 nm to 4 nm. However, the embodiment of the invention is not limited thereto. The thickness of the tunneling layer 20 may be changed.

In this embodiment, defects are removed from the tunneling layer 20 by hydrogen diffused through a hydrogenation process, whereby the tunneling layer 20 has excellent characteristics, which will hereinafter be described in more detail when a manufacturing method is described.

The first conductive semiconductor layer 32 formed of a semiconductor containing the first conductive dopant and hydrogen and the second conductive semiconductor layer 34 formed of a semiconductor containing the second conductive dopant and hydrogen are formed on the tunneling layer 20.

The first conductive semiconductor layer 32 may be formed of a semiconductor (for example, silicon) containing the same first conductive dopant as the semiconductor substrate 10. The first conductive dopant may be the same conductive dopant as the semiconductor substrate 10. That is, in an instance in which the first conductive dopant is an n-type dopant, a group-V element, such as phosphorus (P), arsenic (As), bismuth (Bi), or antimony (Sb), may be used. On the other hand, in an instance in which the first conductive dopant is a p-type dopant, a group-III element, such as boron (B), aluminum (Al), gallium (Ga), or Indium (In), may be used. The first conductive semiconductor layer 32 forms a back surface field structure to prevent loss of a carrier due to recombination at the surface of the semiconductor substrate 10. In addition, the first conductive semiconductor layer 32 may reduce contact resistance with the first electrode 42.

The second conductive semiconductor layer 34 may be formed of a semiconductor (for example, silicon) containing the opposite conductive dopant (the second conductive dopant) to the semiconductor substrate 10. In this instance, the second conductive dopant may be the opposite conductive dopant to the semiconductor substrate 10. That is, in an instance in which the second conductive dopant is a p-type dopant, a group-III element, such as boron (B), aluminum (Al), gallium (Ga), or Indium (In), may be used. On the other hand, in an instance in which the second conductive dopant is an n-type dopant, a group-V element, such as phosphorus (P), arsenic (As), bismuth (Bi), or antimony (Sb), may be used. The second conductive semiconductor layer 34 forms a tunnel junction with the semiconductor substrate 10 via the tunneling layer 20 to substantially contribute to photoelectric conversion.

In this instance, the first and second conductive semiconductor layers 32 and 34 (may also be polycrystalline) may be formed of an amorphous semiconductor (for example, amorphous silicon) doped with the first and second conductive dopants and having high hydrogen content and have a thickness of 100 nm or less (for example, 10 nm to 50 nm). Defects are removed from the first and second conductive semiconductor layers 32 and 34 due to the high hydrogen content, whereby the first and second conductive semiconductor layers 32 and 34 may have excellent characteristics.

For example, the first and second conductive semiconductor layers 32 and 34 may have a hydrogen content of 7 at % to 20 at %, which is set such that the first and second conductive semiconductor layers 32 and 34 sufficiently function while defects are removed from the first and second conductive semiconductor layers 32 and 34. That is, in an instance in which the first and second conductive semiconductor layers 32 and 34 have a hydrogen content of 7 at %, the first and second conductive semiconductor layers 32 and 34 may have excellent passivation characteristics. In addition, in an instance in which the first and second conductive semiconductor layers 32 and 34 have a hydrogen content of 20 at % or less, the first and second conductive semiconductor layers 32 and 34 may have excellent electrical characteristics. In a conventional solar cell, on the other hand, although hydrogen is contained in the first and second conductive semiconductor layers 32 and 34 (more specifically, a semiconductor layer 30 (see FIG. 3C) during formation of the semiconductor layer 30, the hydrogen is discharged out of the semiconductor layer 30 at a process (for example, a doping process) performed at high temperature. As a result, the hydrogen content is lowered to 3 at % or less, whereby passivation characteristics of the first and second conductive semiconductor layers 32 and 34 may be lowered.

In addition, in an instance in which the first and second conductive semiconductor layers 32 and 34 are formed of amorphous silicon and have a thickness of 100 nm, a process temperature necessary to form the first and second conductive semiconductor layers 32 and 34 may be lowered and a process time necessary to form the first and second conductive semiconductor layers 32 and 34 may be reduced while hydrogen is satisfactorily diffused, which will hereinafter be described in more detail when a manufacturing method is described.

The first and second conductive semiconductor layers 32 and 34 are disposed on the same plane while having a uniform thickness. When viewed from the top, therefore, the first and second conductive semiconductor layers 32 and 34 are formed without overlapping. It is not necessary to dispose an additional insulation layer to insulate the first and second conductive semiconductor layers 32 and 34 from each other between the first and second conductive semiconductor layers 32 and 34 which are stacked. This is because the first and second conductive semiconductor layers 32 and 34 are formed by doping the same semiconductor layer 30 with the first conductive dopant and the second conductive dopant which are different from each other. As a result, the structure of the solar cell 100 and a manufacturing method of the solar cell 100 may be simplified. In addition, an unnecessary insulation layer may be removed to reduce the thickness of the solar cell 100.

In the drawing, the first and second conductive semiconductor layers 32 and 34 are shown as being in contact with each other on the same plane. However, the embodiment of the invention is not limited thereto. For example, an intrinsic area not doped with any dopant may be between the first and second conductive semiconductor layers 32 and 34. The intrinsic area may be formed by not doping a portion of the semiconductor layer 30 with the first conductive dopant and the second conductive dopant. In this instance, the intrinsic area may prevent the occurrence of an unnecessary shunt between the first conductive semiconductor layer 32 and the second conductive semiconductor layer 34.

The area of the first conductive semiconductor layer 32 containing the same conductive dopant as the semiconductor substrate 10 may be greater than that of the second conductive semiconductor layer 34 containing the opposite conductive dopant to the semiconductor substrate 10. As a result, the area of the tunnel junction formed between the semiconductor substrate 10 and the second conductive semiconductor layer 34 via the tunneling layer 20 may be further increased. In addition, in an instance in which the semiconductor substrate 10 is an n-type conductive semiconductor substrate, the first conductive semiconductor layer 32 is an n-type conductive semiconductor layer, and the second conductive semiconductor layer 34 is a p-type conductive semiconductor layer as previously described, it is possible to effectively collect holes having relatively low movement speed. The planar structures of the first and second conductive semiconductor layers 32 and 34 will hereinafter be described in more detail with reference to FIG. 2.

The insulation layer 40 may be formed on the first and second conductive semiconductor layers 32 and 34. The insulation layer 40 may prevent incorrect connection between the first and second conductive semiconductor layers 32 and 34 and the electrodes (that is, the second electrode 44 for the first conductive semiconductor layer 32 and the first electrode 42 for the second conductive semiconductor layer 34), thereby passivating the first and second conductive semiconductor layers 32 and 34.

The thickness of the insulation layer 40 may be greater than that of the tunneling layer 20. As a result, insulation and passivation characteristics of the insulation layer 40 may be improved. The insulation layer 40 may be formed of various insulation materials (for example, oxide, nitride, etc.) For example, the insulation layer 40 may have a single film structure or a multi-layer film structure formed of at least one selected from a group consisting of amorphous silicon nitride containing hydrogen, amorphous silicon oxide, silicon oxide nitride, aluminum oxide ($Al_2O_3$), $MgF_2$, ZnS, $TiO_2$, and $CeO_2$, amorphous silicon (for example, intrinsic amorphous silicon), and amorphous silicon carbide (for example, intrinsic amorphous silicon carbide). Amorphous silicon (specifically, intrinsic amorphous silicon doped with no dopant) and amorphous silicon carbide (specifically, intrinsic amorphous silicon carbide doped with no dopant) may have insulation characteristics and thus function as the insulation layer 40. However, the embodiment of the invention is not limited thereto. The insulation layer 40 may be formed of various other materials.

In this instance, the insulation layer 40 may include amorphous silicon nitride and have high hydrogen content. For example, the insulation layer 40 may have a hydrogen content of 1 at % to 25 at %, which is set to facilitate hydrogen diffusion at a hydrogenation process while removing defects from the insulation layer 40, which will hereinafter be described in more detail when a manufacturing method is described.

In this embodiment, the first and second conductive semiconductor layers 32 and 34 may contact the insulation layer 40 formed on the first and second conductive semiconductor layers 32 and 34 to achieve insulation between the first and second conductive semiconductor layers 32 and 34 and the first and second electrodes 42 and 44. That is, a doping layer (for example, a layer including boron silicate glass, phosphorus silicate glass, etc.) during doping of the first and second conductive semiconductor layers 32 and 34 may not be disposed between the first and second conductive semiconductor layers 32 and 34 and the insulation layer 40. As a result, the structure of the solar cell 100 and a manufacturing method of the solar cell 100 may be simplified, which will hereinafter be described in more detail.

The insulation layer 40 includes a first opening 402, through which the first conductive semiconductor layer 32 is exposed, and a second opening 404, through which the second conductive semiconductor layer 34 is exposed.

The first electrode 42 is connected to the first conductive semiconductor layer 32 through the first opening 402 of the insulation layer 40. The second electrode 44 is connected to the second conductive semiconductor layer 34 through the second opening 404 of the insulation layer 40. The first and second electrodes 42 and 44 may be formed of various metal materials. In addition, the first and second electrodes 42 and 44 may be connected to the first and second conductive semiconductor layers 32 and 34, respectively, while not being electrically connected to each other, to have various planar shapes to collect a generated carrier and transmit the carrier to the outside. That is, the embodiment of the invention is not limited to the planer shapes of the first and second electrodes 42 and 44.

Figure 2:
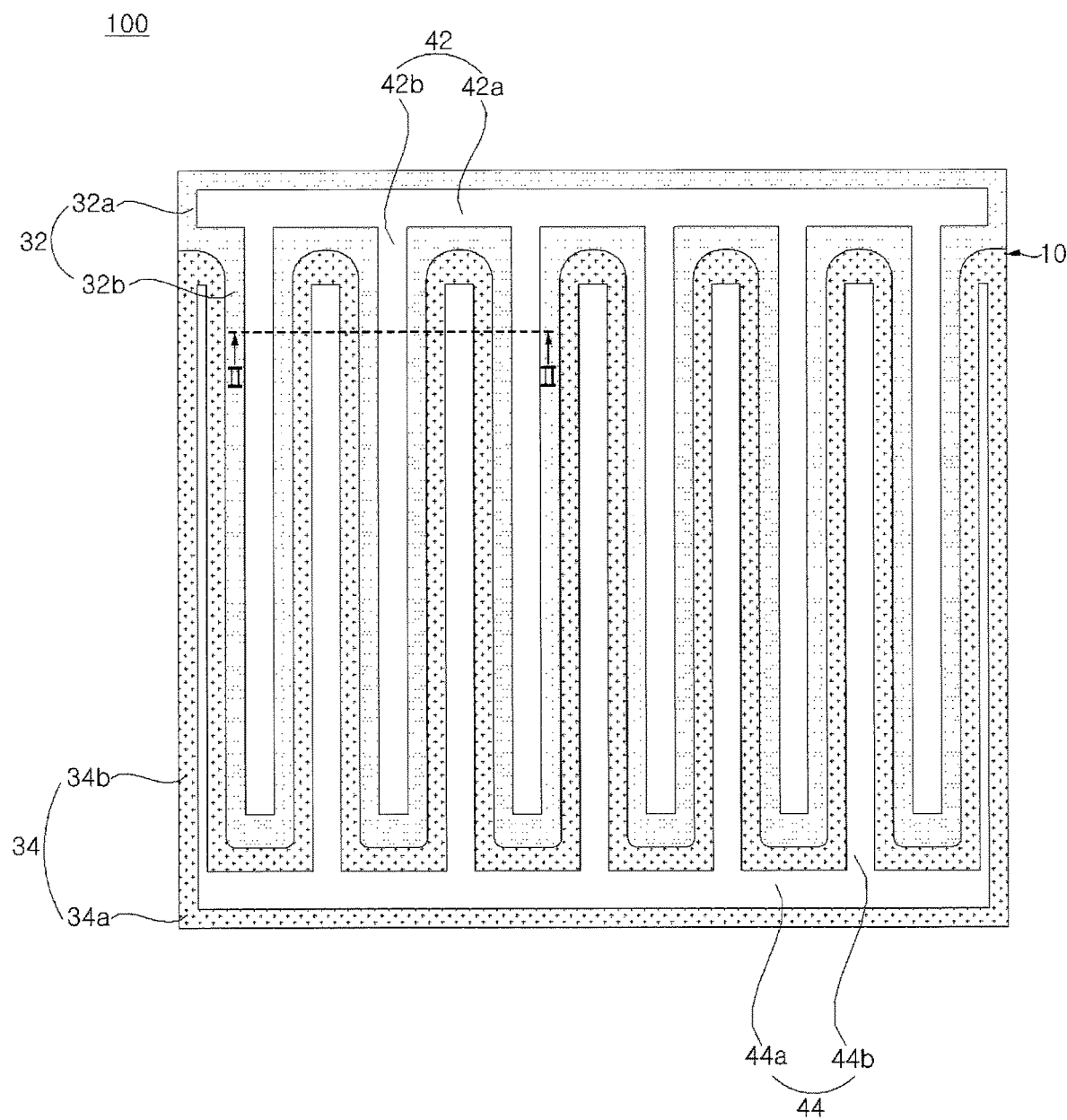
FIG. 2 is a rear plan view of the solar cell according to the embodiment of the invention.

Hereinafter, the planar shapes of the first and second conductive semiconductor layers 32 and 34 and the first and second electrodes 42 and 44 will be described in detail with reference to FIG. 2. FIG. 2 is a rear plan view of the solar cell 100 according to the embodiment of the invention. The shapes of the first and second conductive semiconductor layers 32 and 34 and the first and second electrodes 42 and 44 shown in FIG. 2 are shown by way of example and, therefore, the invention is not limited thereto.

Referring to FIG. 2, in the solar cell 100 according to this embodiment, the first conductive semiconductor layer 32 has a smaller area than the second conductive semiconductor layer 34. As a result, a larger tunnel junction may be formed between the semiconductor substrate 10 and the second conductive semiconductor layer 34 via the tunneling layer 20. In addition, in an instance in which the semiconductor substrate 10 is an n-type conductive semiconductor substrate, the first conductive semiconductor layer 32 is an n-type conductive semiconductor layer, and the second conductive semiconductor layer 34 is a p-type conductive semiconductor layer as previously described, it is possible to effectively collect holes having relatively low movement speed.

To this end, the first conductive semiconductor layer 32 may include a first stem part 32a formed along a first edge (an upper edge in the drawing) of the semiconductor substrate 10 and a plurality of first branch parts 32b extending from the first stem part 32a toward a second edge (a lower edge in the drawing) opposite to the first edge. The first branch parts 32b may be arranged side by side to form a stripe shape. The second conductive semiconductor layer 34 may include a second stem part 34a formed along the second edge of the semiconductor substrate 10 and a plurality of second branch parts 34b extending from the second stem part 34a toward the first edge between the first branch parts 32b. The second branch parts 34b may be arranged side by side to form a stripe shape. The first branch parts 32b of the first conductive semiconductor layer 32 and the second branch parts 34b of the second conductive semiconductor layer 34 are alternately arranged. The tunneling layer 20 may have a shape identical or extremely similar to that of the second conductive semiconductor layer 34. Consequently, the tunneling layer 20 may include a part corresponding to the second stem part 34a and parts corresponding to the second branch parts 34b.

In this instance, the areas of the first conductive semiconductor layer 32 and the second conductive semiconductor layer 34 may be adjusted by changing the widths of the first and second stem parts 32a and 34a and/or the first and second branch parts 32b and 34b. That is, the width of the first stem part 32a may be less than that of the second stem part 34a and/or the width of the first branch parts 32b may be less than that of the second branch parts 34b.

For example, the area of the first conductive semiconductor layer 32 may be 0.5% to 49% (preferably, 20% to 40%) of the total area of the solar cell 100. If the area of the first conductive semiconductor layer 32 is less than 0.5% of the total area of the solar cell 100, contact between the first conductive semiconductor layer 32 and the first electrode 42 may not be correctly performed with the result that contact resistance between the first conductive semiconductor layer 32 and the first electrode 42 may be increased. On the other hand, if the area of the first conductive semiconductor layer 32 is greater than 49% of the total area of the solar cell 100, which means that the area of the second conductive semiconductor layer 34 is small, efficiency of the solar cell 100 may be lowered as described above. In consideration of the efficiency of the solar cell 100, the area of the first conductive semiconductor layer 32 may be 20% to 40% of the total area of the solar cell 100.

The first electrode 42 may include a stem part 42a corresponding to the first stem part 32a of the first conductive semiconductor layer 32 and branch parts 42b corresponding to the first branch parts 32b of the first conductive semiconductor layer 32. Similarly, the second electrode 44 may include a stem part 44a corresponding to the second stem part 34a of the second conductive semiconductor layer 34 and branch parts 44b corresponding to the second branch parts 34b of the second conductive semiconductor layer 34. However, the embodiment of the invention is not limited thereto. The first electrode 42 and the second electrode 44 may have various planar shapes.

As a result, the first electrode 42 are formed on the first conductive semiconductor layer 32 such that the first electrode 42 contacts the first conductive semiconductor layer 32 and the second electrode 44 are formed on the second conductive semiconductor layer 34 such that the second electrode 44 contacts the second conductive semiconductor layer 34. Consequently, the first conductive semiconductor layer 32 and the first electrode 42 are spaced apart from the second conductive semiconductor layer 34 and the second electrode 44, respectively, while the second conductive semiconductor layer 34 is sufficiently secured. As a result, electrical connection between the first conductive semiconductor layer 32 and the first electrode 42 and electrical connection between the second conductive semiconductor layer 34 and the second electrode 44 are stably achieved. The insulation layer 40 may be provided to improve passivation and insulation characteristics. In addition, the insulation layer 40 may serve as a hydrogen supply source at a hydrogenation process as previously described.

In this embodiment, the stems parts 32a and 34a of the first and second conductive semiconductor layers 32 and 34 and the stem parts 42a and 44a of the first and second electrodes 42 and 44 are not a requisite of the solar cell and may be omitted depending upon embodiments.

In the solar cell 100 with the above-stated construction, the first and second conductive semiconductor layers 32 and 34 are formed of an amorphous semiconductor (for example, amorphous silicon) having high hydrogen content. Consequently, the first and second conductive semiconductor layers 32 and 34 may be easily manufactured at a low temperature process while having excellent characteristics, which will hereinafter be described in more detail with reference to FIGS. 3A to 3L. Hereinafter, any redundant description will be omitted and descriptions of only the differences will be described.

FIGS. 3A to 3L are sectional views showing a manufacturing method of a solar cell according to an embodiment of the invention.

Figure 3A:
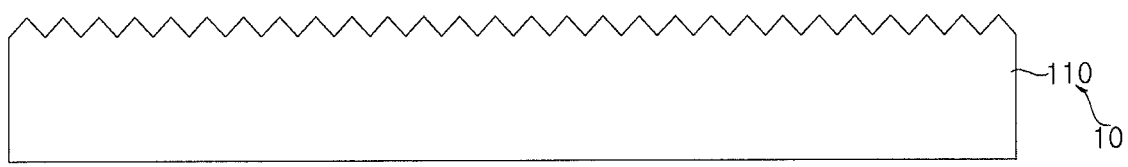
FIGS. 3A to 3L are sectional views showing a manufacturing method of a solar cell according to an embodiment of the invention.

First, as shown in FIG. 3A, a semiconductor substrate 10 including a base region 110 containing a first conductive dopant is prepared. In this embodiment, the semiconductor substrate 10 may be formed of silicon containing an n-type dopant. A group-V element, such as phosphorus (P), arsenic (As), bismuth (Bi), or antimony (Sb), may be used as the n-type dopant.

At this time, the front surface of the semiconductor substrate 10 may be textured such that the front surface of the semiconductor substrate 10 has a concavo-convex shape. The back surface of the semiconductor substrate 10 may be mirror-ground to have a lower surface roughness than the front surface of the semiconductor substrate 10. The front surface of the semiconductor substrate 10 may be textured using wet texturing or dry texturing. In the wet texturing, the semiconductor substrate 10 is soaked in a texturing solution. The wet texturing has an advantage in that process time is short. In the dry texturing, on the other hand, the surface of the semiconductor substrate 10 is cut using a diamond grill or a laser. In the dry texturing, a concavo-convex shape is uniformly formed. However, process time is long and the semiconductor substrate 10 may be damaged. Alternatively, the semiconductor substrate 10 may be textured using reactive ion etching (RIE), etc. In this way, the semiconductor substrate 10 may be textured using various methods. In addition, the back surface of the semiconductor substrate 10 may be processed through the mirror grinding.

Figure 3B:
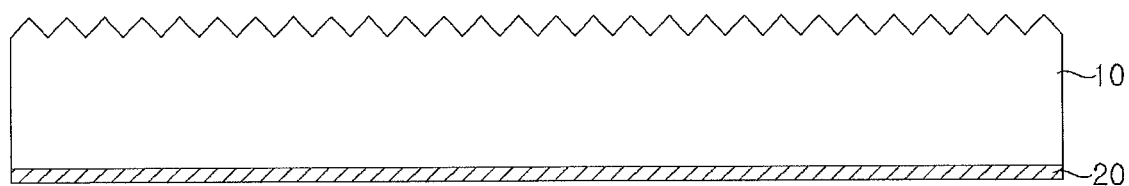

Subsequently, as shown in FIG. 3B, a tunneling layer 20 is formed at the back surface of the semiconductor substrate 10. The tunneling layer 20 may be formed using, for example, a thermal growth method, a deposition method (for example, plasma-enhanced chemical vapor deposition (PECVD) or atomic layer deposition (ALD), etc. However, the embodiment of the invention is not limited thereto. The tunneling layer 20 may be formed using various other methods.

Figure 3C:
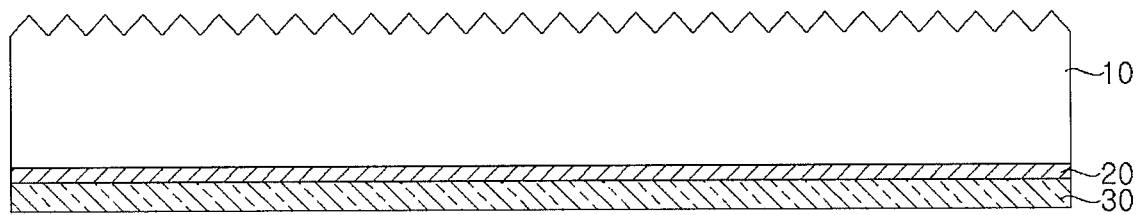

Subsequently, as shown in FIG. 3C, a semiconductor layer 30 is formed on the tunneling layer 20. At this time, the semiconductor layer 30 may be formed of an amorphous semiconductor (for example, amorphous silicon). The semiconductor layer 30, formed of the amorphous semiconductor, may be formed by deposition, which is a low temperature process. For example, the semiconductor layer 30 may be an amorphous semiconductor (for example, amorphous silicon) layer formed by depositing a semiconductor (for example, silicon) at a temperature of 120° C. to 250° C. Since the semiconductor layer 30 includes the amorphous semiconductor, the semiconductor layer 30 may be easily formed by deposition at low temperature. During deposition, hydrogen may be included. As a result, the semiconductor layer 30 may include a hydrogenated amorphous semiconductor. On the other hand, a polycrystalline semiconductor may be formed only at a relatively high temperature of 500° C. or more.

At this time, the semiconductor layer 30 may have a thickness of 100 nm or less (for example, 10 nm to 50 nm). In this embodiment, the semiconductor layer 30, from which first and second conductive semiconductor layers 32 and 34 will be formed, may have a relatively small thickness. Consequently, process time may be reduced.

Subsequently, as shown in FIGS. 3D to 3H, the semiconductor layer 30 is doped with first and second conductive dopants to form a first conductive semiconductor layer 32 and a second conductive semiconductor layer 34, which will hereinafter be described in more detail.

Figure 3D:
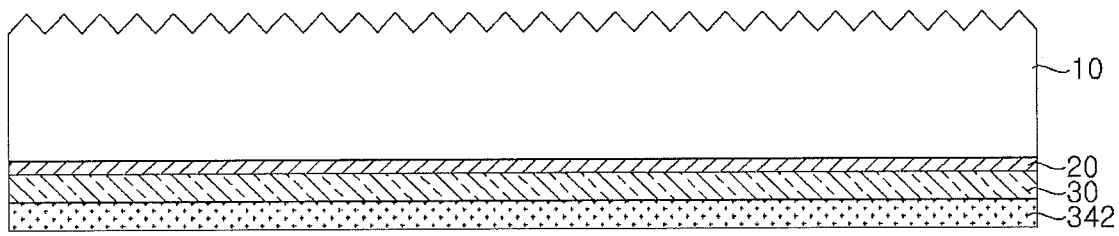

First, as shown in FIG. 3D, a doping layer 342 (hereinafter, referred to as a second doping layer 342) containing a second conductive dopant is entirely formed on the semiconductor layer 30. The second doping layer 342 may be one of various layers containing a second conductive dopant. For example, the second doping layer 342 may be a layer including boron silicate glass (BSG). When the second doping layer 342 formed of boron silicate glass is formed on the semiconductor layer 30 formed of the amorphous semiconductor as described above, the second doping layer 342 is formed at low temperature. For example, the second doping layer 342 may be formed through deposition performed at a temperature of 200° C. to 250° C. If the deposition temperature of the second doping layer 342 is less than 200° C., deposition may not be satisfactorily performed. On the other hand, if the deposition temperature of the second doping layer 342 is greater than 250° C., characteristics of the semiconductor layer 30 may be lowered. The second doping layer 342 may have a thickness of 100 nm or less. However, the embodiment of the invention is not limited thereto.

Figure 3E:
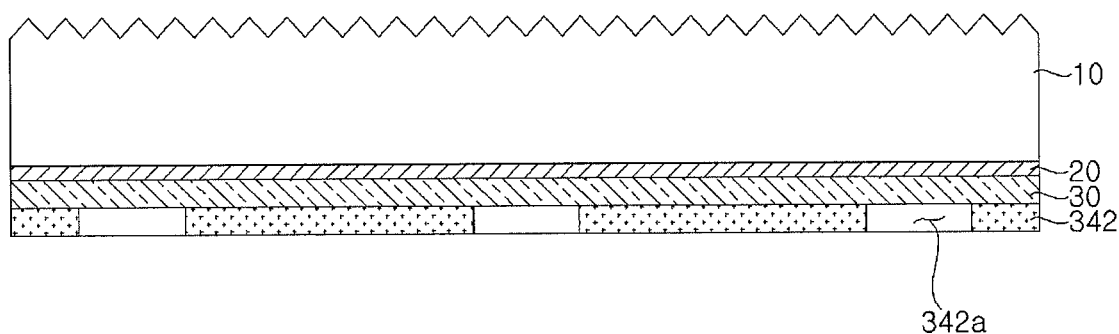

Subsequently, as shown in FIG. 3E, a region of the second doping layer 342 corresponding to a first conductive semiconductor layer 32 is selectively etched to form an opening 342a. The second doping layer 342 may be selectively etched using various methods. For example, a resist layer may be formed on the second doping layer 342 to open a region of the second doping layer 342 at which the first conductive semiconductor layer 32 will be formed (for example, using photolithography) and then the corresponding region of the second doping layer 342 may be etched using an etching solution. Alternatively, an etching paste may be applied to a region of the second doping layer 342 at which the first conductive semiconductor layer 32 will be formed and then the corresponding region of the second doping layer 342 may be etched through a thermal process.

Figure 3F:
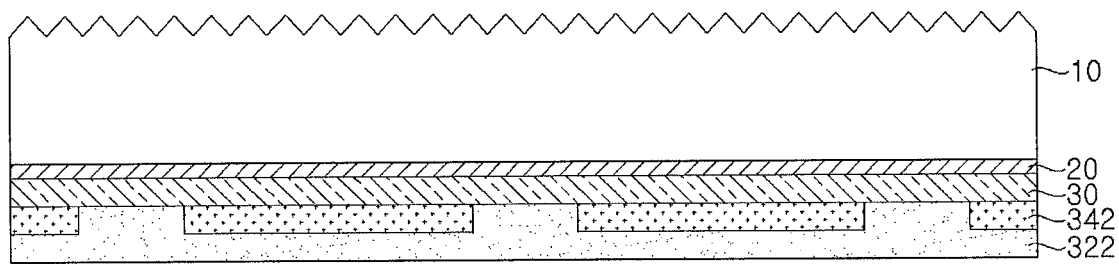

Subsequently, as shown in FIG. 3F, a doping layer 322 (hereinafter, referred to as a first doping layer 322) containing a first conductive dopant is entirely formed on the second doping layer 342 while the opening 342a (see FIG. 3E) of the second doping layer 342 is filled. The first doping layer 322 may be one of various layers containing a first conductive dopant. For example, the first doping layer 322 may be a layer including phosphorus silicate glass (PSG). When the first doping layer 322 formed of phosphorus silicate glass is formed on the semiconductor layer 30 formed of the amorphous semiconductor as described above, the first doping layer 322 is formed at low temperature. For example, the first doping layer 322 may be formed through deposition performed at a temperature of 200° C. to 250° C. If the deposition temperature of the first doping layer 322 is less than 200° C., deposition may not be satisfactorily performed. On the other hand, if the deposition temperature of the first doping layer 322 is greater than 250° C., characteristics of the semiconductor layer 30 may be lowered. The first doping layer 322 may have a thickness of 100 nm or less. However, the embodiment of the invention is not limited thereto.

In this embodiment, as described above, the second doping layer 342 is first formed and then the first doping layer 322 is formed. That is, the second doping layer 342 corresponding to a second conductive semiconductor layer 34 having a relatively large area is entirely formed on the semiconductor layer 30 and then only a small area corresponding to a first conductive semiconductor layer 32 is removed from the second doping layer 342. As a result, process time is reduced. However, the embodiment of the invention is not limited thereto. For example, the second doping layer 342 may be formed on the semiconductor layer 30 using a mask such that the second doping layer 342 has a shape corresponding to the second conductive semiconductor layer 34. Alternatively, the first doping layer 322 may be first formed and then the second doping layer 342 may be formed. Various other modifications are also possible.

Figure 3G:
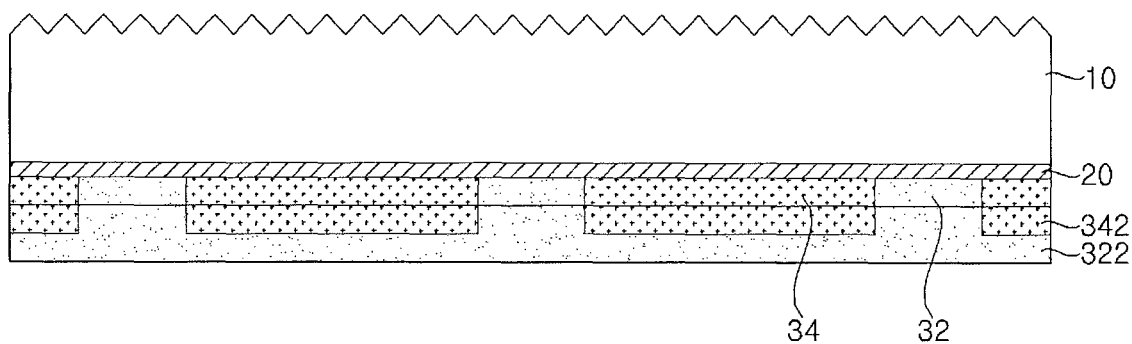

Subsequently, as shown in FIG. 3G, the first conductive dopant from the first doping layer 322 is diffused into the semiconductor layer 30 (see FIG. 3F) through a thermal process to form a first conductive semiconductor layer 32. In addition, the second conductive dopant from the second doping layer 342 is diffused into the semiconductor layer 30 through a thermal process to form a second conductive semiconductor layer 34.

In this embodiment, as described above, the semiconductor layer 30 has a relatively small thickness (for example, 100 nm or less, more specifically 10 nm to 50 nm). Consequently, thermal process temperature and time necessary to diffuse the first and second conductive dopants may be effectively reduced. In addition, the dopants may be easily diffused due to many defects of the semiconductor layer 30 formed of the amorphous semiconductor. Consequently, the dopants may be more quickly diffused than a crystal semiconductor. As a result, thermal process temperature and time for doping may be effectively reduced. For example, thermal process temperature necessary to diffuse the first and second conductive dopants may be 700° C. or less (for example, 600° C. to 700° C.) and thermal process time necessary to diffuse the first and second conductive dopants may be 5 seconds to 5 minutes at a peak temperature. As a result, the manufacturing process may be simplified and manufacturing cost may be reduced. In an instance in which the semiconductor layer 30 is formed of polycrystalline silicon, on the other hand, thermal process temperature for doping may be 900° C. to 1,000° C. and thermal process time for doping may be 30 minutes to 10 hours at the peak temperature.

Figure 3H:
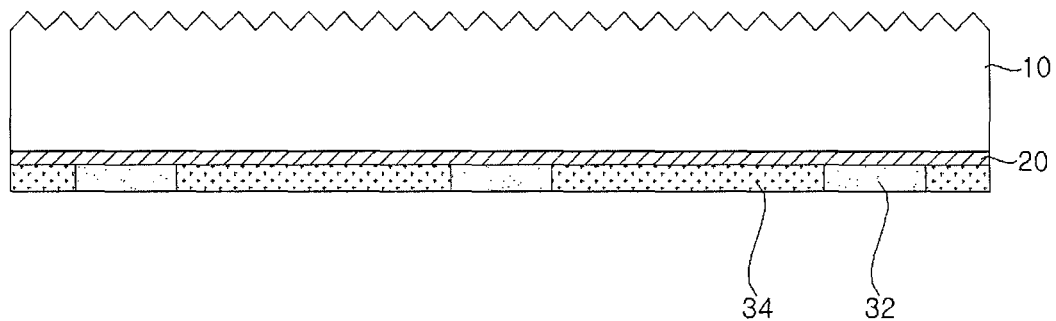

Subsequently, as shown in FIG. 3H, the first doping layer 322 and the second doping layer 342 are removed. The first doping layer 322 and the second doping layer 342 may be removed using various methods. For example, the first doping layer 322 and the second doping layer 342 may be soaked into a diluted hydrofluoric acid solution and then washed using water such that the first doping layer 322 and the second doping layer 342 are removed. However, the embodiment of the invention is not limited thereto. In an instance in which the first doping layer 322 and the second doping layer 342 are removed as described above, it is possible to prevent the occurrence of a bending phenomenon which may be caused when the first doping layer 322 and the second doping layer 342 are not removed.

As described above, the first and second doping layers 322 and 342 are deposited at relatively low temperature and, therefore, the first and second doping layers 322 and 342 have low density. As a result, the first and second doping layers 322 and 342 may be easily removed. On the other hand, when the first and second doping layers 322 and 342 are deposited at high temperature and, therefore, the first and second doping layers 322 and 342 have high density, it may take much time to remove the first and second doping layers 322 and 342. In addition, it may be difficult to remove the first and second doping layers 322 and 342. However, the embodiment of the invention is not limited thereto. For example, the first and second doping layers 322 and 342 may not be removed.

Figure 3I:
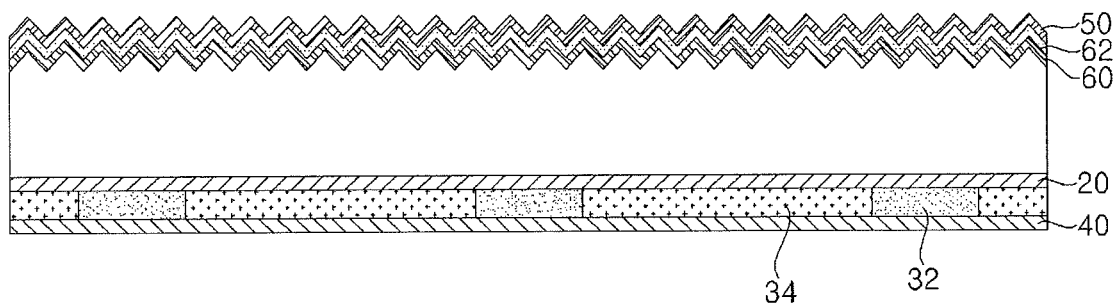

Subsequently, as shown in FIG. 3I, an insulation layer 40 is formed on the first conductive semiconductor layer 32 and the second conductive semiconductor layer 34 at the back surface of the semiconductor substrate 10 and a passivation film 60, a field layer 62, and an anti-reflection film 50 are formed at the front surface of the semiconductor substrate 10. The insulation layer 40 and the passivation film 60 may be formed using various methods, such as vacuum deposition, chemical vapor deposition, spin coating, screen printing, and spray coating. The field layer 62 may be formed by depositing a semiconductor material or by depositing a semiconductor material and then doping the deposited semiconductor material with a first conductive dopant. The anti-reflection film 50 may be formed using various methods, such as vacuum deposition, chemical vapor deposition, spin coating, screen printing, and spray coating.

At this time, the insulation layer 40 may be formed to have high hydrogen content. For example, the insulation layer 40 may have a hydrogen content of 1 at % to 25 at %. If the hydrogen content of the insulation layer 40 is less than 1 at %, it may be difficult to supply hydrogen at or during a hydrogenation process. On the other hand, if the hydrogen content of the insulation layer 40 is greater than 25 at %, it may be difficult to contain or hold hydrogen.

Figure 3J:
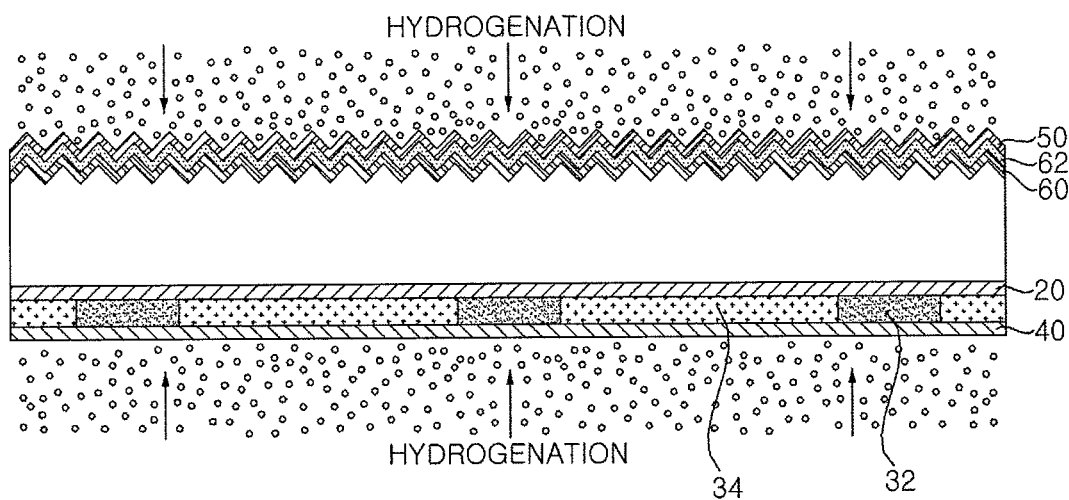

Subsequently, as shown in FIG. 3J, the semiconductor substrate 10, at which the tunneling layer 20, the first and second conductive semiconductor layers 32 and 34, etc. are formed, is hydrogenated.

That is, the semiconductor substrate 10, at which the first and second conductive semiconductor layers 32 and 34, etc., are formed, is put in a hydrogen atmosphere having higher temperature than a room temperature for a predetermined period of time such that hydrogen is introduced into the tunneling layer 20, and the first and second conductive semiconductor layers 32 and 34, etc. Hydrogen may be introduced into the anti-reflection film 50 to remove defects from the anti-reflection film 50.

At this time, the first and second conductive semiconductor layers 32 and 34 have a small thickness of 100 nm and the first and second conductive semiconductor layers 32 and 34 include an amorphous semiconductor (for example, amorphous silicon). As a result, hydrogen diffusion is easily performed. Consequently, it is possible to effectively reduce defect density of the first and second conductive semiconductor layers 32 and 34. As a result, the first and second conductive semiconductor layers 32 and 34 may have a hydrogen content of 7 at % to 20 at %.

At this time, hydrogen contained in the semiconductor layer 30 and the insulation layer 40 during formation of the semiconductor layer 30 and the insulation layer 40 serves as a hydrogen supply source to assist hydrogen diffusion in addition to external hydrogen in the hydrogen atmosphere. As a result, hydrogen may be easily diffused to reduce defects of the tunneling layer 20 and the first and second conductive semiconductor layers 32 and 34. At this time, the tunneling layer 20 serves as an anti-diffusion film to prevent diffusion of hydrogen into the semiconductor substrate 10. As a result, heterojunction between the semiconductor substrate 10 and the second conductive semiconductor layer 34 is maintained.

More specifically, external hydrogen is introduced into the insulation layer 40, hydrogen from the insulation layer 40 is introduced into the first and second conductive semiconductor layers 32 and 34, and hydrogen from the first and second conductive semiconductor layers 32 and 34 is introduced into the tunneling layer 20. In this way, hydrogen is diffused step by step, thereby effectively achieving hydrogen diffusion.

In addition, the first and second conductive dopants doped in the first and second conductive semiconductor layers 32 and 34 are further diffused due to increased temperature, thereby achieving uniform distribution of the dopants in the first and second conductive semiconductor layers 32 and 34.

The hydrogenation process may be performed at a predetermined thermal process temperature at which hydrogen may be introduced for a predetermined period of time. For example, the hydrogenation process may be performed at a temperature of 300° C. to 900° C. for 1 hour or less (for example, 1 minute to 1 hour). If the hydrogenation process is performed at a temperature of less than 300° C., hydrogen diffusion speed may be lowered or hydrogen diffusion may not be satisfactorily performed. On the other hand, if the hydrogenation process is performed at a temperature of greater than 900° C., characteristics of the layers which have already been formed may be lowered or the layers which have already been formed may be deformed due to such high temperature. Thermal process temperature at the hydrogenation process may be changed depending upon kind of the insulation layer 40. In one example, in an instance in which the insulation layer 40 includes intrinsic amorphous silicon containing hydrogen, the thermal process temperature may be 300° C. to 450° C. In another example, in an instance in which the insulation layer 40 includes aluminum oxide containing hydrogen, the thermal process temperature may be 400° C. to 550° C. In a further example, in an instance in which the insulation layer 40 includes silicon nitride containing hydrogen, the thermal process temperature may be 400° C. to 700° C. In addition, in an instance in which the thermal process time exceeds 1 hour, process time may be increased. However, the embodiment of the invention is not limited thereto. Thermal process temperature and hydrogen content may be variously changed.

In this embodiment, the insulation layer 40 containing hydrogen is formed and then the hydrogen contained in the insulation layer 40 is diffused to perform the hydrogenation process. As a result, thermal process temperature for the hydrogenation process is not restricted and no hydrogen atmosphere is need, thereby stably performing the hydrogenation process.

However, the embodiment of the invention is not limited thereto. For example, the first and second conductive semiconductor layers 32 and 34 may be annealed in a hydrogen atmosphere device (for example, a furnace or a raid thermal process device) to perform the hydrogenation process. In this instance, the hydrogenation process may be performed after the insulation layer 40 is formed. Alternatively, the hydrogenation process may be performed before the insulation layer 40 is formed or without forming the insulation layer 40.

In the hydrogen atmosphere device, hydrogen content may be 10 vol % or more (for example, 10 vol % to 100 vol %) and thermal process temperature may be 400° C. to 550°

C. In an instance in which hydrogen content is 10 vol % or more, it is possible to sufficiently hydrogenate the first and second conductive semiconductor layers 32 and 34 through the hydrogenation process. Hydrogen content may be 100 vol %. In an instance in which hydrogen content is high, however, a decompression device may be further provided in consideration of explosiveness of hydrogen. In an instance in which hydrogen content is less than 100 vol %, an inert gas, such as nitrogen ($N_2$) or argon (Ar), may be contained in addition to hydrogen. If a thermal process temperature is less than 400° C., the hydrogenation process may not be sufficiently performed. On the other hand, if the thermal process temperature is greater than 550° C., stability may be lowered. However, the embodiment of the invention is not limited thereto. Hydrogen content and thermal process temperature in the hydrogen atmosphere device may be variously changed.

Figure 3K:
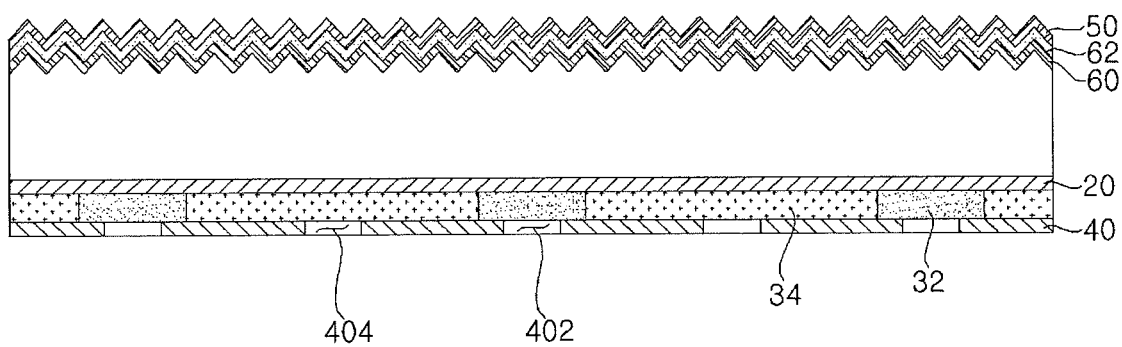

Subsequently, as shown in FIG. 3K, first and second openings 402 and 404 are formed at the first and second conductive semiconductor layers 32 and 34, respectively. The first and second openings 402 and 404 may be formed using various methods.

Figure 3L:
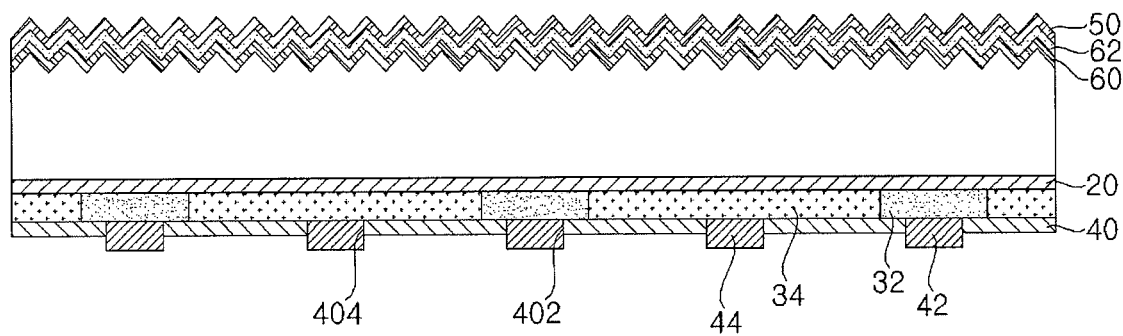

Subsequently, as shown in FIG. 3L, electrode materials are deposited in the first and second openings 402 and 404 to form first and second electrodes 42 and 44. In this embodiment, the first and second electrodes 42 and 44 are formed through deposition. Consequently, the solar cell 100 may be manufactured at low temperature. In addition, it is possible to effectively prevent damage to the first and second conductive semiconductor layers 32 and 34 which may be caused when a fire through process is used. However, the embodiment of the invention is not limited thereto. The first and second electrodes 42 and 44 may be manufactured using various methods.

In this embodiment, the relatively thin semiconductor layer 30 including the amorphous semiconductor (for example, amorphous silicon) is formed on the tunneling layer 20, the first and second conductive dopants are diffused in the semiconductor layer 30 to form the first and second conductive semiconductor layers 32 and 34, and the hydrogenation process is performed to reduce defect density of the first and second conductive semiconductor layers 32 and 34. At this time, the first and second conductive dopants may be easily diffused due to many defects of the amorphous semiconductor and the small thickness of the semiconductor layer 30. As a result, it is possible to reduce process temperature and time to diffuse the first and second conductive dopants. After the first and second conductive semiconductor layers 32 and 34 are formed, hydrogen is diffused in the tunneling layer 20 and the first and second conductive semiconductor layers 32 and 34 through the hydrogenation process to remove defects, thereby greatly improving passivation characteristics.

Meanwhile, it is actually difficult to dope the first and second conductive semiconductor layers at the process of depositing the amorphous semiconductor. For example, when the dopants are doped during the process of depositing the amorphous semiconductor, it is necessary to perform a process of entirely forming an amorphous semiconductor layer doped with one dopant and then removing a portion of the amorphous semiconductor layer. When the amorphous semiconductor layer is etched, however, the semiconductor substrate may also be etched with the result that the semiconductor substrate may be damaged. In addition, a p-type amorphous semiconductor layer may be hardly etched to such an extent than the p-type amorphous semiconductor layer may be used as an etch stopper.

That is, in this embodiment, it is possible to simplify the manufacturing process of the solar cell 100 while improving characteristics of the solar cell 100 based on the material, thickness, and manufacturing process of the semiconductor layer 30 (or the first and second conductive semiconductor layers 32 and 34).

In the above embodiment, the tunneling layer 20, the first and second conductive semiconductor layers 32 and 34, the insulation layer 40 are formed, the passivation film 60 and the anti-reflection film 50 are formed, and the first and second electrodes 42 and 44 are formed. However, the embodiment of the invention is not limited thereto. For example, the formation sequence of the tunneling layer 20, the first and second conductive semiconductor layers 32 and 34, the insulation layer 40, the passivation film 60, the anti-reflection film 50, and the first and second electrodes 42 and 44 may be variously changed.

Hereinafter, solar cells according to other embodiments of the invention will be described in more detail with reference to FIGS. 4 to 6. A detailed description of components of these embodiments identical or similar to those of the previous embodiment will be omitted and only the difference therebetween will be described in detail.

Figure 4:
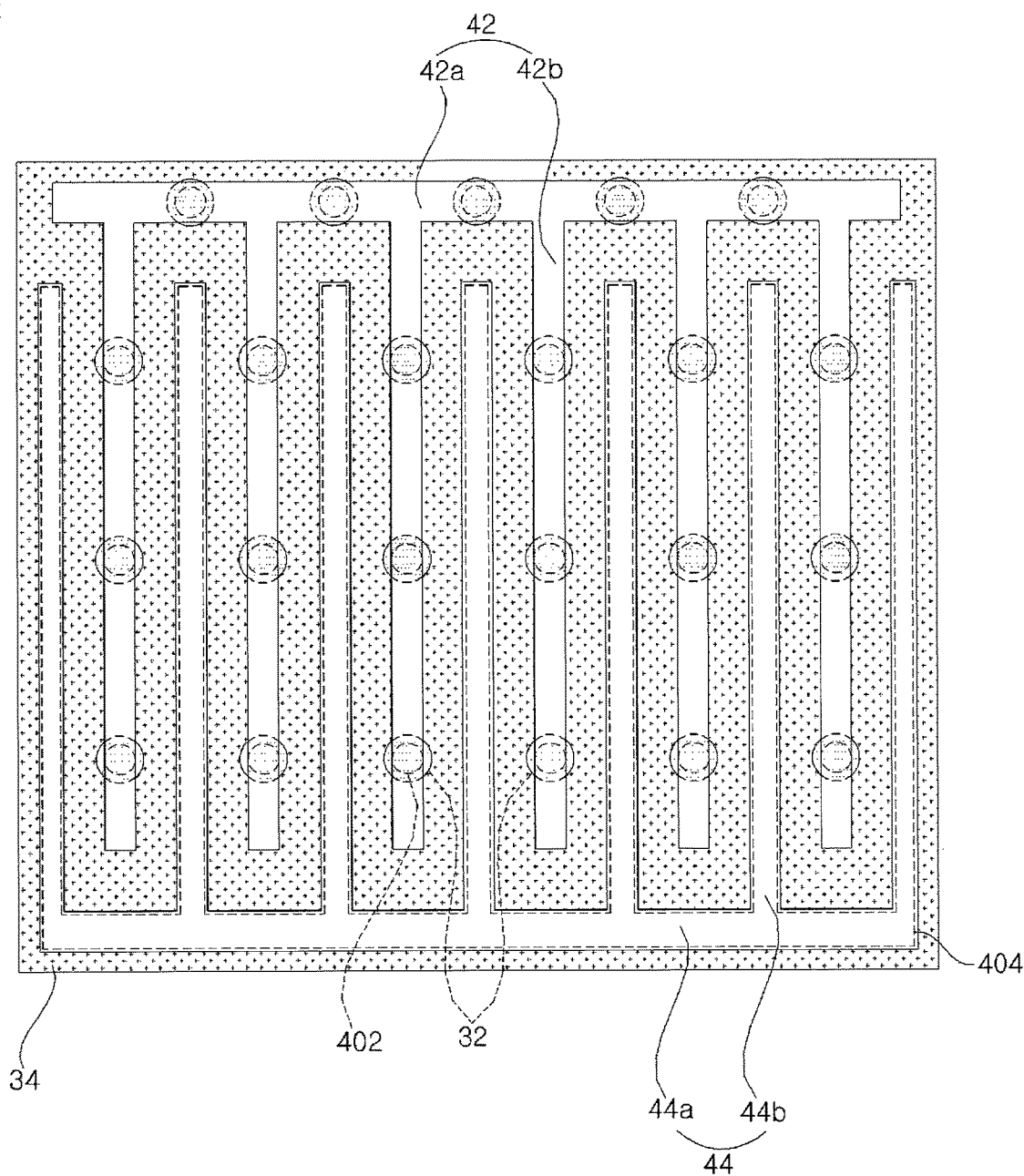
FIG. 4 is a rear plan view of a solar cell according to another embodiment of the invention.

FIG. 4 is a rear plan view of a solar cell according to another embodiment of the invention. For more simple illustration, an insulation layer 40 (see FIG. 1 will not be shown in FIG. 4.

Referring to FIG. 4, in this embodiment, a first conductive semiconductor layer 32 of this embodiment may include a plurality of regions connected to a first electrode 42 while being spaced apart from each other. The regions may have an island shape. As a result, the first conductive semiconductor layer 32 may be disposed over a semiconductor substrate 10 while the area of the first conductive semiconductor layer 32 is minimized. That is, it is possible to maximize the area of a second conductive semiconductor layer 34 while effectively preventing surface recombination due to the first conductive semiconductor layer 32. However, the embodiment of the invention is not limited thereto. For example, the first conductive semiconductor layer 32 may have various shapes to minimize the area of the first conductive semiconductor layer 32.

In the drawing, the first conductive semiconductor layer 32 is shown as having a circular shape. However, the embodiment of the invention is not limited thereto. For example, the first conductive semiconductor layer 32 may have a polygonal shape, such as an oval shape, a triangular shape, a quadrangular shape, or a hexagonal shape.

The first conductive semiconductor layer 32 may have a width or diameter of 50 μm to 1000 μm. If the width or diameter of the first conductive semiconductor layer 32 is less than 50 μm, it may be difficult to satisfactorily achieve electrical connection between the first conductive semiconductor layer 32 and a first electrode 42. On the other hand, if the width or diameter of the first conductive semiconductor layer 32 is greater than 1000 μm, the area of the second conductive semiconductor layer 34 may be decreased or a pitch of the first conductive semiconductor layer 32 may be increased. In further consideration of connection between the first conductive semiconductor layer 32 and the first electrode 42 and an area ratio of the first conductive semiconductor layer 32 to the first electrode 42, the first conductive semiconductor layer 32 may have a width or diameter of 100 μm to 500 μm. However, the embodiment of the invention is not limited thereto. According to circumstances, the width or diameter of the first conductive semiconductor layer 32 may be changed.

The second conductive semiconductor layer 34 is not formed at a region corresponding to the first conductive semiconductor layer 32 while having an entirely connected structure. In the drawing, the first conductive semiconductor layer 32 and the second conductive semiconductor layer 34 are shown as being adjacent to each other. However, the embodiment of the invention is not limited thereto. For example, the first conductive semiconductor layer 32 and the second conductive semiconductor layer 34 may be spaced apart from each other.

A first opening 402 for connection between the first conductive semiconductor layer 32 and the first electrode 42 and a second opening 404 for connection between the second conductive semiconductor layer 34 and a second electrode 44 are formed at an insulation layer 40. The first opening 402 may have an island shape corresponding to the first conductive semiconductor layer 32. The second opening 404 may have a shape identical or similar to that of the second electrode 44. In this way, the first and second openings 402 and 404 may have different shapes based on the island shape of the first conductive semiconductor layer 32 and the entirely connection shape of the second conductive semiconductor layer 34. As a result, insulation between the first electrode 42 and the second conductive semiconductor layer 34 may be stably maintained while electrical connection between the first electrode 42 and the island-shaped first conductive semiconductor layer 32 is satisfactorily achieved. In addition, the second electrode 44 may entirely contact the second conductive semiconductor layer 34 to improve carrier collection efficiency. However, the embodiment of the invention is not limited thereto. The shapes of the first and second openings 402 and 404 may be changed.

Figure 5:
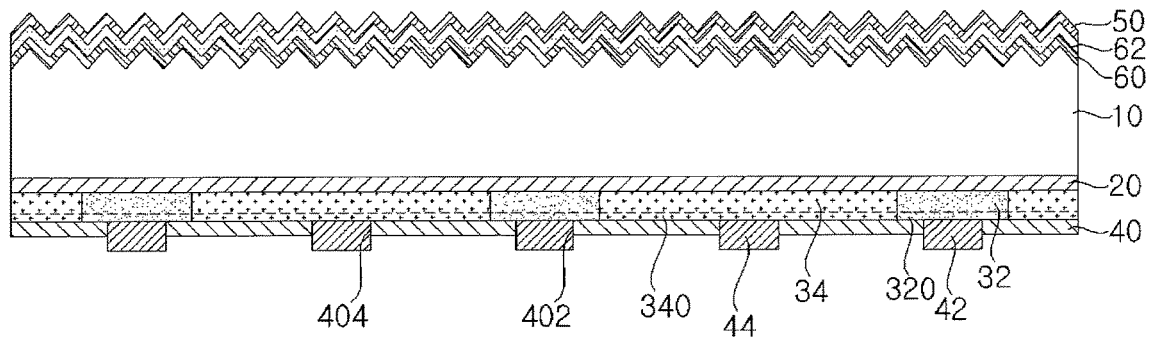
FIG. 5 is a sectional view of a solar cell according to another embodiment of the invention.

FIG. 5 is a sectional view of a solar cell according to another embodiment of the invention.

Referring to FIG. 5, in this embodiment, junction layers 320 and 340 (or a junction layer 320 and 340) including a micro crystal semiconductor (for example, micro crystal silicon) are formed between first and second conductive semiconductor layers 32 and 34 and first and second electrodes 42 and 44, respectively. The junction layers 320 and 340 may be configured as layers different from the first and second conductive semiconductor layers 32 and 34. Alternatively, a portion of the first and second conductive semiconductor layers 32 and 34 adjacent to the first and second electrodes 42 and 44 may have increased micro crystal semiconductor fraction. This structure may be formed by adjusting a rate of gas injected at a process (for example, deposition) of forming a semiconductor layer 30 (see FIG. 3C), from which the first and second conductive semiconductor layers 32 and 34 will be formed. For example, when hydrogen content is increased during formation of the semiconductor layer 30 by deposition, a content of the micro crystal semiconductor is increased. When a portion of the semiconductor layer 30 corresponding to the junction layers 320 and 340 is formed, therefore, hydrogen content may be increased to form the micro crystal semiconductor. The junction layers 320 and 340 including the micro crystal semiconductor may be formed using various other methods.

As described above, the junction layers 320 and 340 including the micro crystal semiconductor may be formed in contact with the first and second electrodes 42 and 44 to improve electrical contact characteristics between the first and second conductive semiconductor layers 32 and 34 and the first and second electrodes 42 and 44. When the junction layers 320 and 340 are formed as described above, excellent contact characteristics may be achieved although the first and second electrodes 42 and 44 are formed using various methods (for example, a fire through method).

Figure 6:
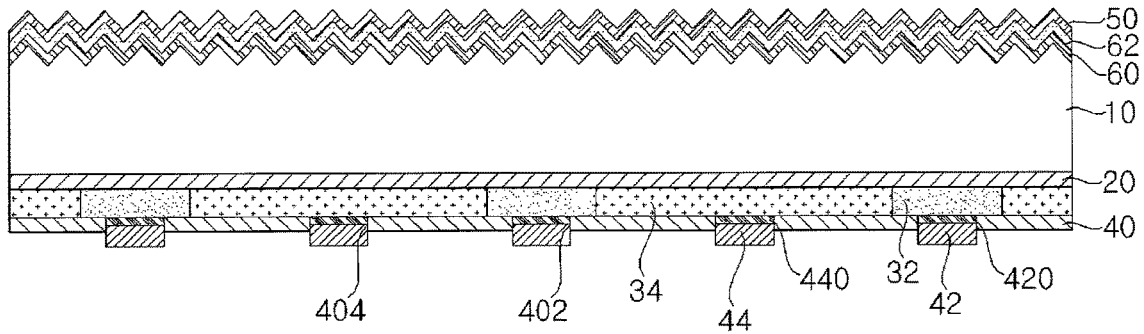
FIG. 6 is a sectional view of a solar cell according to another embodiment of the invention.

FIG. 6 is a sectional view of a solar cell according to another embodiment of the invention.

Referring to FIG. 6, in this embodiment, junction layers 320 and 340 including a transparent conductive material are formed between first and second conductive semiconductor layers 32 and 34 and first and second electrodes 42 and 44, respectively. For example, the junction layers 320 and 340 may include indium-tin oxide. The junction layers 320 and 340 and the first and second electrodes 42 and 44 are manufactured as follows. As shown in FIG. 3K, the first and second openings 402 and 404 may be formed and then the junction layers 320 and 340 may be formed by depositing a transparent conductive material. Subsequently, as shown in FIG. 3L, the first and second electrodes 42 and 44 may be formed on the junction layers 320 and 340, respectively.

The junction layers 320 and 340 including the transparent conductive material may be formed in the openings 402 and 404 of the insulation layer 40 in contact with the first and second electrodes 42 and 44. As a result, the junction layers 320 and 340 may improve electrical contact characteristics between the first and second conductive semiconductor layers 32 and 34 and the first and second electrodes 42 and 44. When the junction layers 320 and 340 are formed as described above, excellent contact characteristics may be achieved although the first and second electrodes 42 and 44 are formed using various methods (for example, a fire through method).

In the above embodiments, the semiconductor layer 30 or the first and second conductive semiconductor layers 32 and 34 are formed of an amorphous semiconductor (for example, amorphous silicon). However, the embodiment of the invention is not limited thereto. The semiconductor layer 30 or the first and second conductive semiconductor layers 32 and 34 may at least partially include a polycrystalline semiconductor or a micro crystal semiconductor. Even in an instance in which the semiconductor layer 30 or the first and second conductive semiconductor layers 32 and 34 at least partially include a polycrystalline semiconductor or a micro crystal semiconductor, hydrogen may be introduced at a hydrogenation process to reduce defect density. As a result, characteristics of the first and second conductive semiconductor layers 32 and 34 may be improved.

The above described features, configurations, effects, and the like are included in at least one of the embodiments of the invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the embodiments of the invention as disclosed in the accompanying claims.

What is claimed is:

1. A manufacturing method of a back contact solar cell, the manufacturing method comprising:
   forming a tunneling oxide layer on one surface of a single crystalline silicon substrate;
   depositing an amorphous silicon layer on the tunneling oxide layer, wherein the amorphous silicon layer is hydrogenated amorphous silicon;
   doping the amorphous silicon layer with a first conductive dopant and a second conductive dopant to form a first conductive semiconductor layer and a second conductive semiconductor layer;

forming an insulation layer on the amorphous silicon layer having the first conductive semiconductor layer and the second conductive semiconductor layer, wherein the insulation layer has a hydrogen content of 1 at % to 25 at %;

hydrogenating the amorphous silicon layer and the tunneling oxide layer by diffusing hydrogen of the insulation layer into the amorphous silicon layer, wherein the amorphous silicon layer has a hydrogen content of 7 at % to 20 at % after the hydrogenating;

forming a first opening and a second opening in the insulation layer, forming a first electrode to contact the first conductive semiconductor layer through the first opening; and forming a second electrode to contact the second conductive semiconductor layer through the second opening.

2. The manufacturing method according to claim 1, wherein the amorphous silicon layer is deposited at a temperature of 120° C. to 250° C.

3. The manufacturing method according to claim 1, wherein the doping of the amorphous silicon layer with the first conductive dopant and the second conductive dopant comprises:

forming a first doping layer containing the first conductive dopant on the amorphous silicon layer at a region corresponding to the first conductive semiconductor layer and a second doping layer containing the second conductive dopant on the amorphous silicon layer at a region corresponding to the second conductive semiconductor layer; and diffusing the first conductive dopant and the second conductive dopant into the amorphous silicon layer through a thermal process to form the first conductive semiconductor layer and the second conductive semiconductor layer.

4. The manufacturing method according to claim 3, wherein the forming of the first doping layer and the second doping layer comprises:

forming the second doping layer;
removing a region of the second doping layer corresponding to the first conductive semiconductor layer; and
forming the first doping layer at a region corresponding to the first conductive semiconductor layer.

5. The manufacturing method according to claim 3, wherein the first conductive semiconductor layer is n-type, the second conductive semiconductor layer is p-type, the first doping layer comprises a phosphorus silicate glass, and the second doping layer comprises a boron silicate glass.

6. The manufacturing method according to claim 3, further comprising removing the first doping layer and the second doping layer between the doping of the amorphous silicon layer with the first conductive dopant and the second conductive dopant and the diffusing of the hydrogen into the amorphous silicon layer.

7. The manufacturing method according to claim 6, wherein the insulation layer is formed on the amorphous silicon layer in contact with the amorphous silicon layer between the removing of the first doping layer and the second doping layer and the diffusing of the hydrogen into the amorphous silicon layer.

8. The manufacturing method according to claim 1, wherein the first and second electrodes are respectively connected to the first and second conductive semiconductor layers after the diffusing of the hydrogen into the amorphous silicon layer.

9. The manufacturing method according to claim 1, further comprising:

forming an anti-reflection film.

10. The manufacturing method according to claim 1, wherein, in the diffusing of the hydrogen into the amorphous silicon layer, the hydrogen included in the insulation layer formed on the first and second conductive semiconductor layers is diffused into the amorphous silicon layer at a temperature of 400° C. to 550° C.

11. The manufacturing method according to claim 1, further comprising:

depositing a conductive material between the first and second conductive semiconductor layers and the first and second electrodes through the first and second openings.

12. The manufacturing method according to claim 11, wherein the conductive material comprises a transparent conductive material.

13. The manufacturing method according to claim 1, wherein, in the diffusing of the hydrogen into the amorphous silicon layer, the tunneling layer blocks the hydrogen from hydrogenating the semiconductor substrate.

14. The manufacturing method according to claim 1, wherein the hydrogenating is performed in a hydrogen atmosphere.

* * * * *